United States Patent [19]
Neill

[11] Patent Number: 5,734,445
[45] Date of Patent: Mar. 31, 1998

[54] CURRENT GENERATING SYSTEM FOR REMOTE CONTROL DEVICES

[76] Inventor: James Neill, 506 Fairwood St., Ferndale, Mich. 48220

[21] Appl. No.: 617,574

[22] Filed: Mar. 19, 1996

[51] Int. Cl.$^6$ ........................................................ H03J 9/00
[52] U.S. Cl. ........................ 348/734; 359/146; 367/197
[58] Field of Search ...................... 348/734, 211; 341/176; 367/197; 455/151.1, 151.2, 151.3, 151.4, 352; 310/75 B; 359/142–148

[56] References Cited

U.S. PATENT DOCUMENTS

| | | | |
|---|---|---|---|
| 1,015,298 | 1/1912 | Cleland | 310/75 B |
| 1,366,461 | 1/1921 | Johnson | 310/75 B |
| 1,411,615 | 4/1922 | Evans | |
| 4,799,003 | 1/1989 | Tu et al. | 322/29 |

FOREIGN PATENT DOCUMENTS

| | | | |
|---|---|---|---|
| 0656612 | 7/1995 | European Pat. Off. | G08C 17/00 |
| 0217280 | 8/1995 | Japan | E05B 49/00 |

Primary Examiner—John K. Peng
Assistant Examiner—Nathan J. Flynn
Attorney, Agent, or Firm—Palmer C. DeMeo

[57] ABSTRACT

A hand held remote controller for operating an electronic device from a distance having its own self-contained source of electric current. The remote controller has a mechanical energy source for operating an a.c. voltage generator, a d.c. voltage converter to rectify a.c. voltage to d.c. voltage and doubling it. A regulator controls the d.c. voltage sent to the remote controller.

The mechanical energy source is a spring motor in one embodiment, or a spring biased depressible handle attached to a rack and pinion motor in another embodiment.

7 Claims, 2 Drawing Sheets

CURRENT GENERATING SYSTEM FOR REMOTE CONTROL DEVICES

BACKGROUND OF THE INVENTION

This invention relates to remote controllers for operating electronic equipment, such as television sets, and, in particular, to a remote controller with its own current generating system for operating it.

In the past, remote controllers have used several "AAA" or "AA" batteries as the source of electrical power. However, if the remote controller is used to operate several electronic devices, it does not take long before the batteries have to be replaced. Since dry cell batteries when used in series, tend to drain about the same rate, all of the batteries must be replaced. The expense and inconvenience of having to change batteries can become a burden. While it is possible to use rechargeable batteries, the fact that the remote controller has to be out of commission and the electronic devices are not functional is an inconvenience. Most electronic devices are designed to operate by a remote controller, and to manually operate them is slow and awkward.

The best solution is to have a universal remote controller which generates it own electrical current. There have been various small electrical devices patented which generate a direct current for operating said devices; however, there has not been a self contained remote controller for operating electronic devices. The most common patented electrical device which generates a direct current (d.c.) is the flashlight where a mechanical energy rotates a generator rotor in a stator to produce a current. The mechanical energy is either in the form of a spring motor as in U.S. Pat. No. 2,277,897, issued to Alexander; a reciprocating rack and pinion connected to a gear motor as in U.S. Pat. No. 1,411,615, issued to Evans, of a hand held crank gear motor as in U.S. Pat. No. 2,393,813, issued to Roggan.

In U.S. Pat. No. 4,799,003, issued to Tu et al, a spring operated generator produces alternating current (a.c.) which is converted to d.c. voltage to operate electronic timepieces, cameras or radio receivers.

SUMMARY OF THE PRESENT INVENTION

A remote controller is provided for controlling electronic devices at a distance using a mechanical energy source to drive a rotary electric energy generator to produce a current to operate the remote controller. The generator produces a.c. voltage which is converted by an electric circuitry to d.c. voltage used by the remote controller to send a signal to an electronic device.

The mechanical energy source may be a spring driven motor having a windup key and gear system; or a depressible handle drive connected to a rack and pinion to operate a gear system. In each case a gear system rotates a rotor in a stator to produce a.c. voltage. A rectifier circuit and capacitors converts the a.c. voltage to d.c. voltage and doubles it to increase the voltage. A regulator controls the voltage output sent to a signal circuit. The mechanically operated generator and circuitry replaces the dry cell batteries in a remote controller.

DESCRIPTION OF THE INVENTION

Figure 1:
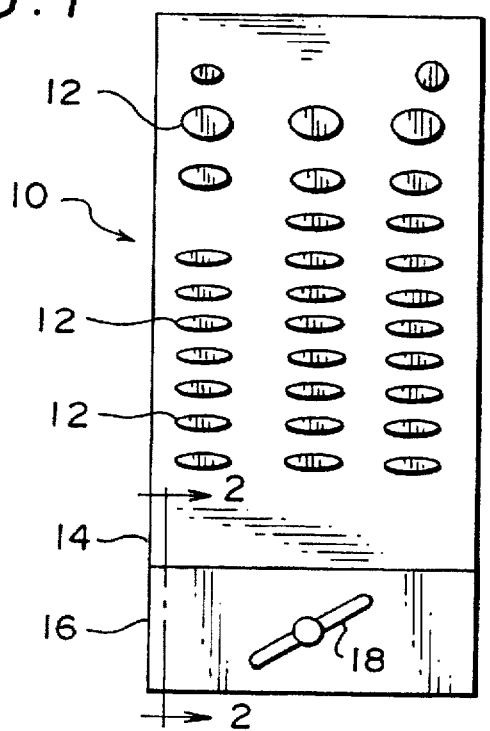
FIG. 1 is a front plan view of a remote controller of the invention.

Referring to FIGS. 1-5, there is shown in FIG. 1 a remote controller 10 having a series of push buttons 12, controls for sending a command to an electronic device, not shown. The controller 10 has a housing 14 with a lower generator compartment 16 which protrudes from the controller. A wind-up key 18 extends from the generator compartment 16. Key 18 is connected by a shaft 20 to a spring motor 22, having a gear system 24 for rotating a rotor 26 of a generator 28, FIG. 5.

Figure 4:
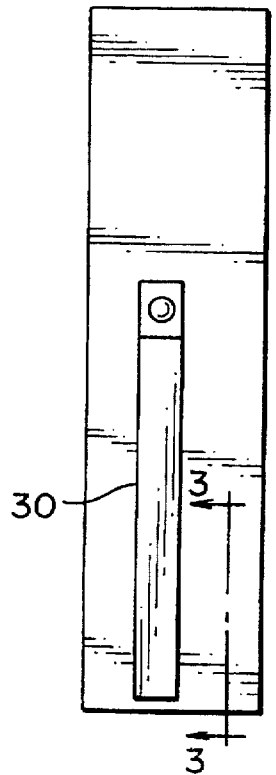
FIG. 4 is a side plan view of FIG. 3.
Figure 3:
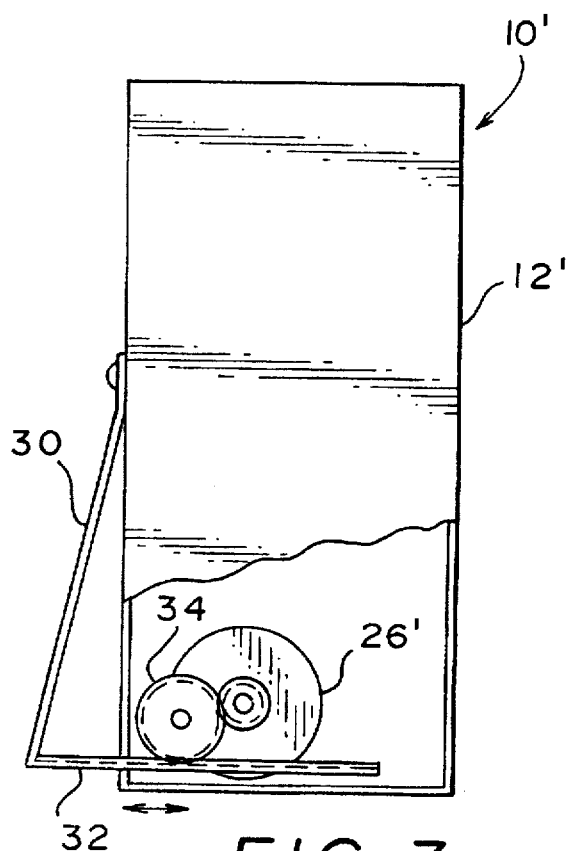
FIG. 3 is a front plan view of another embodiment of a remote controller with a partial cross-section taken along the line 3—3 of FIG. 4.

In a second embodiment, FIGS. 3 and 4, a housing 12' has a depressible hand 30 pivotal to one side. The handle 30 is a spring biased metal which resists depression. Handle 30 is connected to a reciprocating gear rack 32 that in turn meshes with the gear teeth of pinion gear 34. A generator rotor 26' is rotated by the reciprocating mechanical action of gear rack 32 to cause generator 28 to produce a.c. voltage.

Figure 5:
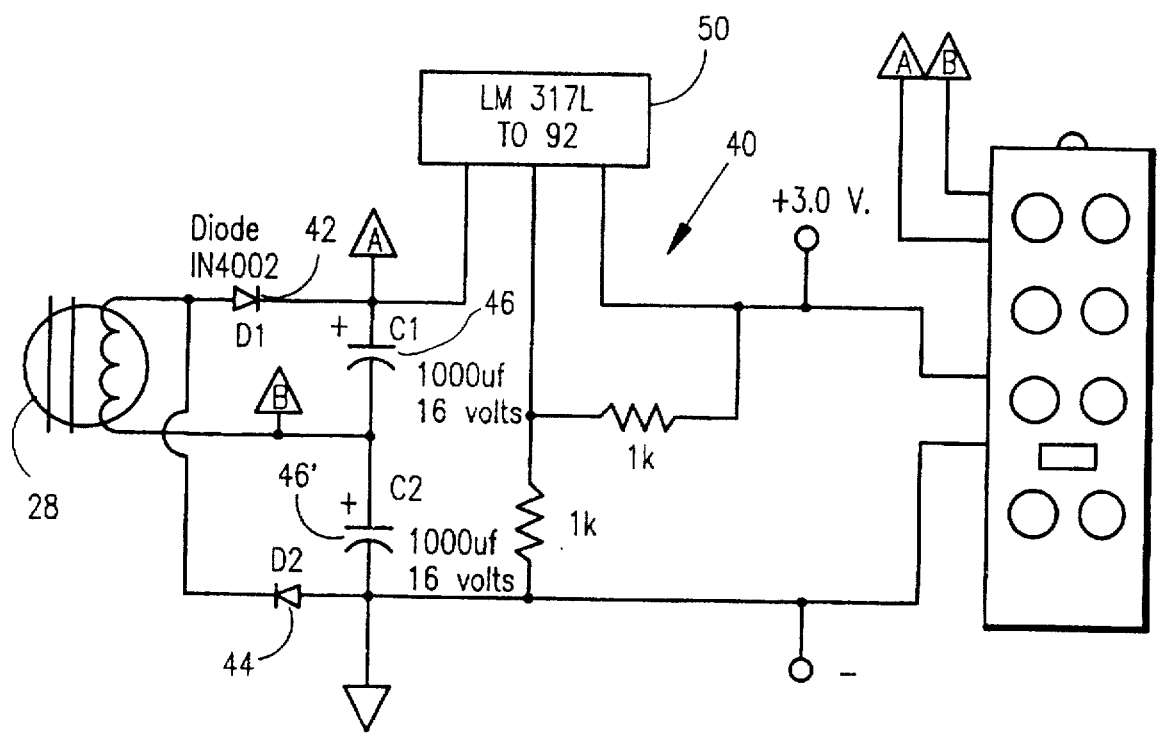
FIG. 5 is a schematic diagram of a circuitry used in the invention.

FIG. 5 shows a typical generator and rectifier-doubler circuitry 40 for converting a.c. voltage to d.c. voltage and doubling it. Generator 28 produces a voltage by the mechanical energy sources of FIGS. 1 and 2, or 3 and 4. The produced a.c. voltage is rectified by diodes 42 and 44 and doubled by fixed capacitors 46 and 46'. The result is that five volts of a.c. voltage is rectified and doubled to 10 volts of d.c. voltage. A regulator 50 limits the output of voltage to three volts d.c. which is needed to operate the remote controller. The generator 28 and circuitry are wired in the battery compartment, not shown, of remote controller 10 or 10'.

Figure 2:
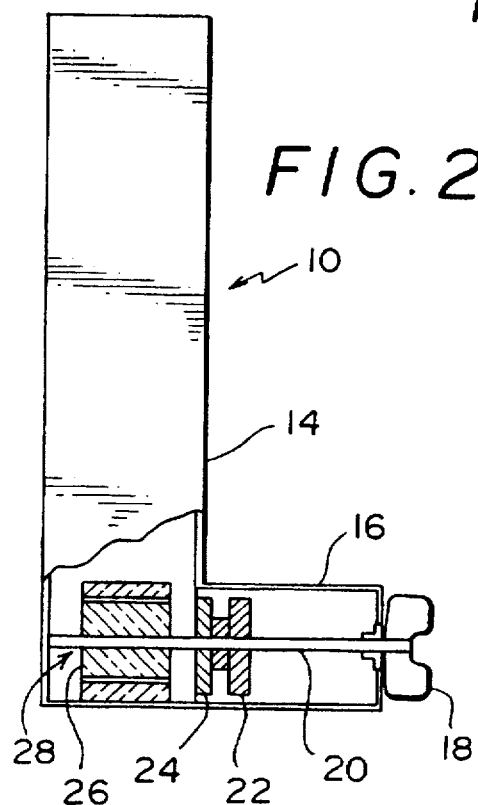
FIG. 2 is a side plan view of the remote controller with a partial cross-section taken along the line 2—2 of FIG. 1.

In use in either remote controller 10 or 10', a gear system, not shown, is operated by a mechanical spring energy system, FIGS. 1 and 2, or a mechanical spring biased depressible handle energy system, FIGS. 3 and 4, to rotate a rotor 26 or 26' to cause generator 28 to produce a.c. voltage that is converted by rectifier-doubler circuitry 40 into usable d.c. voltage.

While only two embodiments have been shown, it is understood that other embodiments may be realized, therefore one should study the drawings, description and claims for a complete understanding of the invention.

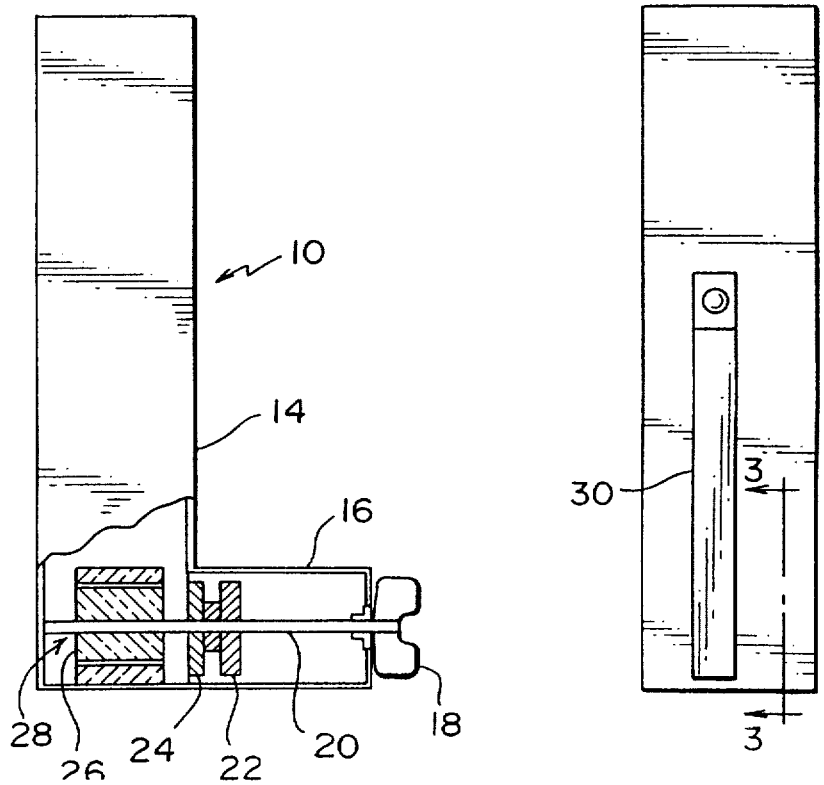

I claim:

1. A hand held remote controller having a mechanical energy source, an a.c. voltage generator and an a.c. to d.c. voltage converter for producing a d.c. voltage for generating a signal, said remote controller comprising:

a housing having a plurality of push buttons for controlling said signal to an electronic device;

a compartment within said housing for containing said mechanical energy source, said a.c. voltage generator and said a.c. to d.c. voltage converter;

said a.c. voltage generator having an output and said a.c. to d.c. voltage converter having an input and an output;

said mechanical energy source being mechanically connected to said a.c. voltage generator and, when energized, drives aid a.c. voltage generator to produce an a.c. voltage at the output of said a.c. voltage generator, the input of said a.c. to d.c. voltage converter being connected to the output of said a.c. voltage generator for converting said a.c. voltage to a d.c. voltage and doubling said d.c. voltage, and, a regulator means within said housing and connected to the output of said a.c. to d.c. voltage converter for controlling the output d.c. voltage of said converter to a constant value for generating said signal from said remote controller.

2. The remote controller recited in claim 1 wherein said mechanical energy source is a spring motor.

3. The remote controller recited in claim 1 wherein said mechanical energy source is a rack and pinion motor operable by a hand depressible, spring biased means.

4. The remote controller recited in claim 1 wherein said a.c. voltage generator produces five volts a.c. and said a.c. to d.c. voltage converter, having a plurality of capacitors and diodes in circuit, rectifies and doubles said five volts a.c. to ten volts d.c.

5. The remote controller recited in claim 4 wherein said mechanical energy source is a spring motor.

6. The remote controller recited in claim 4 wherein said mechanical energy source is a rack and pinion motor operable by a hand depressible, spring biased means.

7. A hand held remote controller having a mechanical energy source, an a.c. voltage generator and an a.c. to d.c. voltage converter for producing a d.c. voltage for generating a signal, said remote controller comprising:

a housing having a plurality of push buttons for controlling said signal to an electronic device;

a compartment within said housing for containing said mechanical energy source, said a.c. voltage generator and said d.c. voltage converter;

said mechanical energy source being mechanically connected to said a.c. voltage generator and, when energized, drives said a.c. voltage generator to produce an a.c. voltage at the output of said a.c. voltage generator, the input of said a.c. to d.c. voltage converter being connected to the output of said a.c. voltage generator for converting said a.c. voltage to a d.c. voltage and doubling said d.c. voltage;

a regulator means within said housing and connected to the output of said a.c. to d.c. voltage converter for controlling the output d.c. voltage of said converter to a constant value for generating said signal from said remote controller; and, said mechanical energy source including a spring biased, depressible handle which is pivotally attached at one end to said housing and mechanically connected at an opposite end to a reciprocating gear rack and pinion gear, said pinion gear having teeth which mesh with said reciprocating gear rack to operate said a.c. generator.

* * * * *

UNITED STATES PATENT AND TRADEMARK OFFICE
CERTIFICATE OF CORRECTION

PATENT NO. : 5,734,445  
DATED : March 31, 1998  
INVENTOR(S) : James Neill

Page 1 of 2

It is certified that error appears in the above-identified patent and that said Letters Patent is hereby corrected as shown below:

The title page, showing the illustrative figure, should be deleted and substitute therefor the attached title page.

Signed and Sealed this

Twenty-sixth Day of May, 1998

Attest:

BRUCE LEHMAN

Attesting Officer

Commissioner of Patents and Trademarks

United States Patent [19]

Neill

[11] Patent Number: 5,734,445
[45] Date of Patent: Mar. 31, 1998

[54] CURRENT GENERATING SYSTEM FOR REMOTE CONTROL DEVICES

[76] Inventor: James Neill, 506 Fairwood St., Ferndale, Mich. 48220

[21] Appl. No.: 617,574

[22] Filed: Mar. 19, 1996

[51] Int. Cl.⁶ .................................................. H03J 9/00
[52] U.S. Cl. ...................... 348/734; 359/146; 367/197
[58] Field of Search ............................. 348/734, 211; 341/176; 367/197; 455/151.1, 151.2, 151.3, 151.4, 352; 310/75 B; 359/142–148

[56] References Cited

U.S. PATENT DOCUMENTS

| | | | |
|---|---|---|---|
| 1,015,298 | 1/1912 | Cleland | 310/75 B |
| 1,366,461 | 1/1921 | Johnson | 310/75 B |
| 1,411,615 | 4/1922 | Evans | |
| 4,799,003 | 1/1989 | Tu et al. | 322/29 |

FOREIGN PATENT DOCUMENTS

| | | | |
|---|---|---|---|
| 0656612 | 7/1995 | European Pat. Off. | G08C 17/00 |
| 0217280 | 8/1995 | Japan | E05B 49/00 |

*Primary Examiner*—John K. Peng
*Assistant Examiner*—Nathan J. Flynn
*Attorney, Agent, or Firm*—Palmer C. DeMeo

[57] ABSTRACT

A hand held remote controller for operating an electronic device from a distance having its own self-contained source of electric current. The remote controller has a mechanical energy source for operating an a.c. voltage generator, a d.c. voltage converter to rectify a.c. voltage to d.c. voltage and doubling it. A regulator controls the d.c. voltage sent to the remote controller.

The mechanical energy source is a spring motor in one embodiment, or a spring biased depressible handle attached to a rack and pinion motor in another embodiment.

7 Claims, 2 Drawing Sheets